(12) United States Patent
Ishibashi et al.

(10) Patent No.: US 6,909,161 B2
(45) Date of Patent: Jun. 21, 2005

(54) PHOTODIODE

(75) Inventors: Tadao Ishibashi, Hiratsuka (JP); Yukihiro Hirota, Atsugi (JP); Yoshifumi Muramoto, Isehara (JP)

(73) Assignee: NTT Electronics Corporation, Tokyo (JP)

(*) Notice: Subject to any disclaimer, the term of this patent is extended or adjusted under 35 U.S.C. 154(b) by 0 days.

(21) Appl. No.: 10/497,490

(22) PCT Filed: Dec. 3, 2002

(86) PCT No.: PCT/JP02/12635

§ 371 (c)(1), (2), (4) Date: Jun. 3, 2004

(87) PCT Pub. No.: WO03/049202

PCT Pub. Date: Jun. 12, 2003

(65) Prior Publication Data

US 2005/0001239 A1 Jan. 6, 2005

(30) Foreign Application Priority Data

Dec. 4, 2001 (JP) ........................ 2001-370597

(51) Int. Cl.$^7$ ........................................... H01L 31/075
(52) U.S. Cl. ..................... 257/458; 257/21; 257/53; 257/80; 257/113; 257/184; 257/451; 257/464
(58) Field of Search ................ 257/10, 11, 21, 257/53–56, 80–85, 113–118, 184–189, 449–458

(56) References Cited

U.S. PATENT DOCUMENTS 5,818,096 A * 10/1998 Ishibashi et al. ............. 257/458
5,998,851 A * 12/1999 Nishikata ..................... 257/436
2002/0050592 A1   5/2002 Kakinuma

FOREIGN PATENT DOCUMENTS

| EP | 0 793 279 | 9/1997 |
| EP | 0 800 219 | 10/1997 |
| JP | 9-275224 | 10/1997 |
| JP | 10-233524 | 9/1998 |
| JP | 2001-168372 | 6/2001 |
| JP | 2002-158369 | 5/2002 |

OTHER PUBLICATIONS

Shimizu et al., "InP–InGaAs Uni–Traveling–Carrier Photodiode with Improved 3–dB Bandwidth of Over 150 GHz", *IEEE Photonics Technology Letters*, vol. 10, No. 3, pp. 412–414, Mar. 1998.

Ishibashi et al., "Uni–Traveling–Carrier Photodiodes", *OSA TOPS on Ultrafast Electronics and Optoelectronics*, vol. 13, 1997.

* cited by examiner

*Primary Examiner*—Andy Huynh
(74) *Attorney, Agent, or Firm*—Dickstein Shapiro Morin & Oshinsky LLP

(57) ABSTRACT

A photodiode has an optical absorption layer composed of a depleted first semiconductor optical absorption layer with a layer width $W_D$ and a p-type neutral second semiconductor optical absorption layer with a layer width $W_A$. The ratio between $W_A$ and $W_D$ is set such that the total carrier transit time $\tau_{tot}$ becomes minimum in the optical absorption layer. The photodiode can further include a depleted semiconductor optical transmission layer with a bandgap greater than that of the first semiconductor optical absorption layer, between the first semiconductor optical absorption layer and an n-type semiconductor electrode layer.

6 Claims, 6 Drawing Sheets

PHOTODIODE

TECHNICAL FIELD

The present invention relates to a photodiode, and more particularly to a broadband, high internal quantum efficiency, ultrafast photodiode that can greatly alleviate the problem of "tradeoff between response speed and internal quantum efficiency".

BACKGROUND ART

Conventional photodiodes used as a photodetector are roughly divided into a pin-photodiode (pin-PD) and a unitraveling-carrier photodiode (UTC-PD) according to their structures.

The pin-PD has a structure in which an intrinsic (i-type) optical absorption (=active) layer that is depleted in a reverse-biased state is sandwiched by a large band gap p-type electrode layer and n-type electrode layer. For a required frequency range of response, the thickness of the active region is designed and internal quantum efficiency is determined.

On the other hand, the UTC-PD has a structure in which a p-type neutral optical absorption layer that is doped beyond a predetermined concentration to prevent the depletion in the reverse-biased state and a large band-gap i layer that is depleted in the reverse-biased state are sandwiched by a p-type electrode layer and n-type electrode layer. The operation principle of the photodiode is described in Japanese patent application laid-open No. 9-275224 (1997) in more detail.

In addition, to solve a problem of a conventional photodiode in that its optical absorption layer must be thickened to improve the photoelectric conversion efficiency, and hence it cannot respond to a high-speed optical signal, Japanese patent application laid-open No. 10-233524 (1998) discloses a hybrid semiconductor photo-detector. The hybrid semiconductor photo-detector has the optical absorption layer composed of two layers, a p-type upper optical absorption layer and a high resistance n-type lower optical absorption layer, there by implementing the pin-PD structure and UTC-PD structure with a substantially single structure.

The semiconductor photo-detector with such a structure can achieve stable response speed with little variations. This is because when a specified reverse-bias is applied across the two optical absorption layers, the high resistance n-type lower optical absorption layer is depleted in its entirety to increase the drift speed of the photoexcited holes, and the p-type upper optical absorption layer provides high diffusion speed to minority electrons, which contributes to the photoelectric conversion, even if the entire p-type layer is not depleted.

However, Japanese patent application laid-open No. 10-233524 (1998) places main emphasis upon increasing the efficiency of the photodiode, and does not disclose how to design the structure of the diode for a frequency response bandwidth required. From the beginning, it has not been discussed in this technical field as to whether the structure of the diode with the two optical absorption layers is advantageous or not to increase the speed of the photodiode.

When light is launched onto the photodiode, the incident light generates electron-hole pairs in the optical absorption layer. These electrons and holes are separated in the layer, causing a current to flow through an external electronic circuit. Generally, as the optical absorption layer becomes thicker, the response speed of the photodiode is reduced because of the prolonged carrier transit time through the layer, but the active region can absorb the light more sufficiently, thereby improving the internal quantum efficiency. In other words, there is a tradeoff between the response speed and the internal quantum efficiency the most important two factors determining the performance of the photodiode, via the thickness of the optical absorption layer, and the compromise between them is primarily important.

The intrinsic response speed determined by the carrier transit speed will be described briefly. The response speed of the pin-PD is almost determined by the transit time of the holes with lower drift speed. The transit time $\tau_D$ of the holes approximated by neglecting the transit speed of the electrons is given by the following expression under uniform optical illumination, $$\tau_D(\text{pin}) = W_D/3v_h. \tag{1}$$

The frequency response (3-dB down bandwidth: $f_{3dB}$), which is a measure of response speed, is approximated by the following expression, $$f_{3dB}(\text{pin}) = 1/(2\pi\tau_D), \tag{2}$$

where $v_h$ is the drift speed of the holes, and $W_D$ is a depletion layer width.

On the other hand, in the UTC-PD, the electron transit speed in the i-layer with the large band gap depleted in the reverse-biased state is much greater than the electron transit speed in the p-type neutral optical absorption layer. Accordingly, an effective carrier transit time $\tau_A$ is substantially controlled by the optical absorption layer with the slower electron transit speed, and is given by the following expression under the uniform optical illumination, $$\tau_A(UTC\text{-}PD) = W_A^2/3D_e + W_A/v_{th}, \tag{3}$$

assuming diffusive electron transport.

In addition, the frequency response (3-dB down bandwidth: $f_{3dB}$) is also determined by the diffusion current of the electrons, and is approximated by the following expression, $$f_{3dB}(UTC\text{-}PD) = 1/(2\pi\tau_A), \tag{4}$$

where $D_e$ is a diffusion coefficient of the electrons, $v_{th}$ is a thermionic emission velocity of the electrons, and $W_A$ is the width of the p-type neutral absorption layer.

According to expressions (1)–(4), the dependence of the 3 dB bandwidth on the width of the optical absorption layer is given by the following expression for the pin-PD, $$f_{3dB}(\text{pin}) \propto 1/W_D. \tag{5}$$

As for the UTC-PD, it is given by the following expression when the term $W_A/v_{th}$ is relatively small, $$f_{3dB}(UTC\text{-}PD) \propto 1/W_A^2. \tag{6}$$

Thus, the dependence of the 3 dB bandwidth on the width of the optical absorption layer differs greatly for the pin-PD and UTC-PD. Specifically, it shows an inclination that the bandwidth of the pin-PD is high in a region where the optical absorption layer is thick, and the bandwidth of the UTC-PD becomes high as the optical absorption layer becomes thinner.

To design the high-speed photodiode with increased response speed, it is advantageous to employ the UTC-PD structure. In this case, however, the optical absorption layer must be made thinner, which brings about the reduction in the internal quantum efficiency. Consequently, although the UTC-PD can achieve high speed operation, it leaves the problem of the "tradeoff between the response speed and internal quantum efficiency", which reduces the internal quantum efficiency of the device for the high-speed operation.

DISCLOSURE OF THE INVENTION

The present invention is implemented to solve the foregoing problems. Therefore it is an object of the present invention to provide a broad bandwidth, high internal quantum efficiency photodiode giving the solution to the problem of the "tradeoff between the response speed and internal quantum efficiency".

To accomplish the object of the present invention, there is provided a photodiode including an n-type semiconductor electrode layer, an optical absorption layer having a first semiconductor optical absorption layer and a second semiconductor optical absorption layer having a p-type, and a p-type semiconductor electrode layer, which are stacked sequentially, the photodiode further including an n-type electrode formed on the n-type semiconductor electrode layer, and a p-type electrode formed on the p-type semiconductor electrode layer, wherein when a specified reverse-bias is applied across the n-type electrode and the p-type electrode, the first semiconductor optical absorption layer is depleted, and the second semiconductor optical absorption layer remains neutral in a region other than a region near an interface with the first semiconductor optical absorption layer, and wherein in the optical absorption layer with a fixed layer width equal to a sum $(W=W_D+W_A)$ of a layer width $(W_D)$ of the first semiconductor optical absorption layer and a layer width $(W_A)$ of the second semiconductor optical absorption layer, a ratio between $W_D$ and $W_A$ is determined such that $|\Delta\tau_A|=|-\Delta\tau_D|$ holds, where $-\Delta\tau_D$ is a decrease of a hole transit time through the first semiconductor optical absorption layer and $\Delta\tau_A$ is an increase of an electron transit time through the second semiconductor optical absorption layer, when the layer width of the first semiconductor optical absorption layer is made $W_D-\Delta W$, and the layer width of the second semiconductor optical absorption layer is made $W_A+\Delta W$.

In the photodiode, the first semiconductor optical absorption layer and the second semiconductor optical absorption layer may be composed of the same or different compound semiconductor with composition represented by $In_xGa_{1-x}As_yP_{1-y}$, where $0 \leq x$ and $y \leq 1$. In addition, the ratio between the $W_D$ and $W_A$ may be set such that $\tau_{tot}$ given by the following expression becomes minimum, $$\tau_{tot}=W_A{}^3/(3WD_e)+W_A{}^2/(Wv_{th})+W_D{}^2/(3Wv_h),$$

where $D_e$ is a diffusion coefficient of electrons, $v_{th}$ is a thermionic emission velocity of the electrons, and $v_h$ is a drift speed of holes.

Moreover, the photodiode may further comprise a semiconductor optical transmission layer between the first semiconductor optical absorption layer and the n-type semiconductor electrode layer, the semiconductor optical transmission layer having a band gap greater than the first semiconductor optical absorption layer, wherein the semiconductor optical transmission layer is depleted when a specified reverse-bias is applied across the n-type electrode and the p-type electrode.

BEST MODE FOR CARRYING OUT THE INVENTION

The best mode for carrying out the invention will now be described with reference to the accompanying drawings. A design idea of the photo diode in accordance with the present invention is as follows. Generally, when optical absorption occurs in halved regions I and II, the optical frequency response in the I region includes the structure parameters of the II region, and the optical frequency response in the optical absorption region of the II region includes the structure parameters of the I region. In other words, the response delay time of the I region is a function of the carrier transit time of the II region as well as that of the I region. As for the response delay time of the II region, a similar relationship holds. Accordingly, the total response of the structure, which consists of the I region and II region coupled, differs from the response of the parallel superposition of the responses of the structures consisting of the I region and II region independently. For example, doubling the layer width of the optical absorption layer in the pin-PD doubles the delay time and halves the bandwidth.

If it is possible to reduce the "mutually dependent relationship between the I region and II region", the total response can be obtained by superimposing the responses of the structure in parallel which includes the I region and II region independently.

(EMBODIMENT 1)

Figure 1:
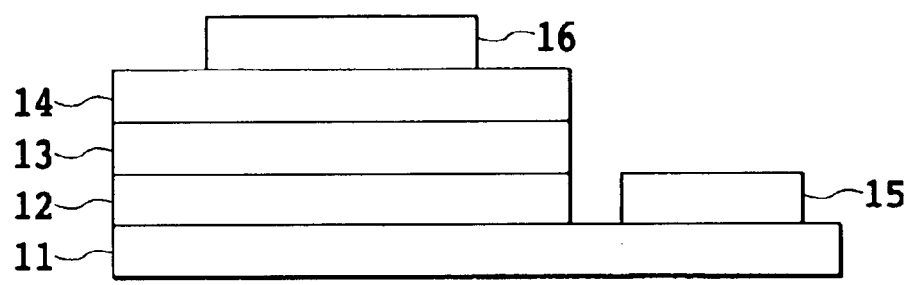
FIG. 1 is a cross-sectional view showing a structure of a photodiode in accordance with the present invention.

FIG. 1 is a cross-sectional view showing a structure of the photodiode in accordance with the present invention. The photodiode includes an n-type semiconductor electrode layer 11 composed of a single-layer or multiple-layers with different band gaps; a first semiconductor optical absorption layer 12 with a film thickness $W_D$, which is depleted in the reverse-biased state; a second semiconductor optical absorption layer 13 with a film thickness $W_A$ which is p-type neutral in the reverse-biased state; and a p-type semiconductor electrode layer 14 composed of the single-layer or multiple-layers with different band gaps. The photodiode is composed of these layers stacked sequentially, and an n-type electrode 15 formed on the n-type semiconductor electrode layer 11, and a p-type electrode 16 formed on the p-type semiconductor electrode layer 14. The ratio between the width of the first semiconductor optical absorption layer 12 and that of the second semiconductor optical absorption layer 13 is determined such that the response speed becomes maximum in the specified operation conditions under the condition that the sum W of the two layer widths (W=$W_D$+$W_A$) is kept constant.

As long as W is fixed, in spite of variations in the ratio between $W_A$ and $W_D$, the total optical absorption coefficient of the semiconductor optical absorption layer little varies, which is composed of the first semiconductor optical absorption layer and the second semiconductor optical absorption layer. Accordingly, the internal quantum efficiency of the photodiode is nearly constant, and hence the performance of the photodiode is just concerned with the response speed.

Figure 2:
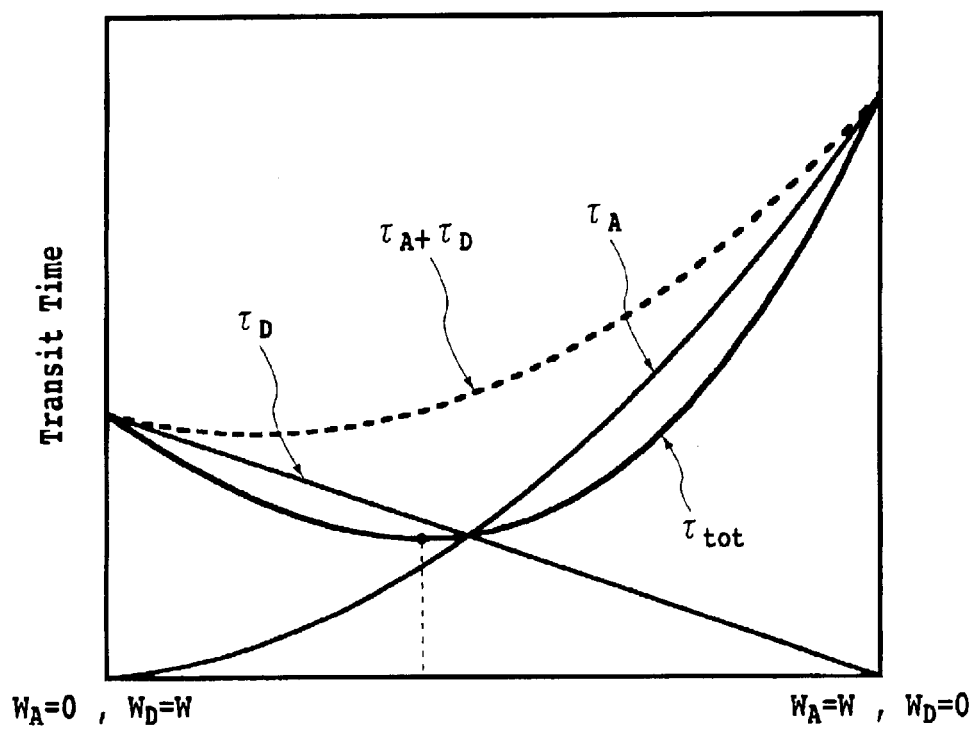
FIG. 2 is a diagram illustrating the carrier transit time in the semiconductor optical absorption layer constituting the photodiode in accordance with the present invention as shown in FIG. 1.

FIG. 2 is a schematic diagram illustrating the carrier transit time in the semiconductor optical absorption layer as shown in FIG. 1. It schematically illustrates the carrier transit time ($\tau_D$, $\tau_A$) for the individual semiconductor optical absorption layers, the sum of the carrier transit times, and the total carrier transit time ($\tau_{tot}$) of the effective semiconductor optical absorption layer, while varying the ratio between the layer width of the depleted first semiconductor optical absorption layer 12 with the layer width $W_D$ and that of the p-type neutral second semiconductor optical absorption layer 13 with the layer width $W_A$ under the condition of maintaining the sum of the layer widths W (=$W_D$+$W_A$) at a fixed value.

As seen from FIG. 2, the total carrier transit time $\tau_{tot}$ of the optical absorption layer, which is the factor that determines the response speed of the photodiode, differs from the simple sum of the electron transit time $\tau_A$ in the $W_A$ region and the hole transit time $\tau_D$ of the $W_D$ region. This is because a current caused by carriers generated in the depleted semiconductor optical absorption layer 12 and a current caused by carriers generated in the p-type neutral semiconductor optical absorption layer 13 flow through the optical absorption layers at the same time.

Figure 3:
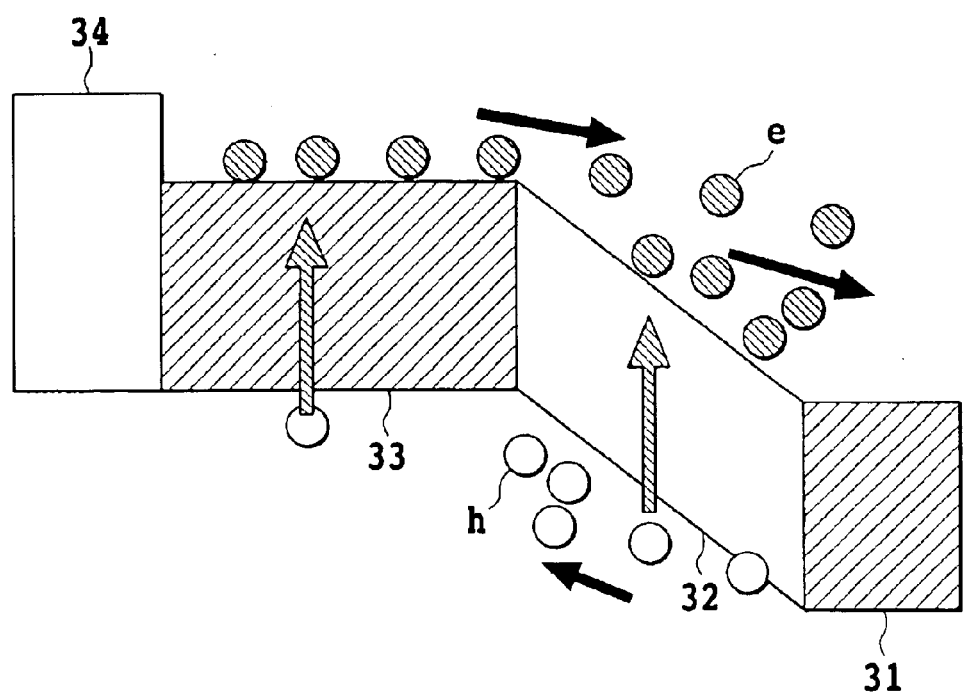
FIG. 3 is a band diagram illustrating the carrier drift in the semiconductor optical absorption layers constituting the photodiode in accordance with the present invention.

FIG. 3 is a band diagram illustrating the drift of the carriers generated in the p-type neutral semiconductor optical absorption layer and the depleted semiconductor optical absorption layer. When the semiconductor optical absorption layers are irradiated of the semiconductor structure including an n-type semiconductor electrode layer 31 composed of a single-layer or multiple-layers with different band gaps, a first semiconductor optical absorption layer 32 with a film thickness $W_D$ which is depleted in the reverse-biased state, a second semiconductor optical absorption layer 33 with a film thickness $W_A$ which is p-type neutral, and a p-type semiconductor electrode layer 34 composed of the single-layer or multiple-layers with different band gaps, which are stacked sequentially, electron-hole pairs are generated in the first semiconductor optical absorption layer 32 and second semiconductor optical absorption layer 33. The electrons drift toward the n-type semiconductor electrode 31, whereas the holes drift toward the p-type semiconductor electrode 34, thereby implementing the condition in which the current flows through a parallel circuit, so to speak.

In this case, the dependence of $\tau_A$ on $W_A$ and the dependence of $\tau_D$ on $W_D$ are $\tau_A \propto W_A^2$, and $\tau_D \propto W_D$, respectively, which means that their dependence on the optical absorption layer width differs. Thus, if the relationship that the increase in $\tau_A$ ($\Delta\tau_A$) is less than a decrease in $\tau_D(-\Delta\tau_D)$ is satisfied, that is, if $|\Delta\tau_A|<|-\Delta\tau_D|$, in the condition that the optical absorption layer width W is constant, the total carrier transit time $\tau_{tot}$ of the optical absorption layer can be reduced by replacing part of the entire optical absorption layer with the layer width of W by the p-type neutral optical absorption layer with the layer width of $W_A$. Consequently, the effective carrier transit time of the diode in its entirety becomes minimum when $|\Delta\tau_A|=|-\Delta\tau_D|$. The phenomenon can be understood by handling the carrier generating behavior in the optical absorption layer by a simple charge control model, while carrying out uniform optical irradiation with maintaining a carrier generating rate G(cm$^{-3}$·s$^{-1}$) per unit volume at a constant value.

The optical illumination forms electron-hole pairs in the optical absorption layer, thereby generating a photocurrent J (=qGW). Generally, as the photocurrent increases, an electron charge $-Q_A$ in the p-type neutral semiconductor optical absorption layer and a hole charge $Q_D$ in the depleted semiconductor optical absorption layer and its neighborhood also increase.

The electron charge $-Q_A$ in the p-type neutral semiconductor optical absorption layer is given by the following expression in a diffusion model, $$-Q_A=-qG[W_A^3/(3D_e)+W_A^2/v_{th}]. \tag{7}$$

Considering that $\tau_A$ is given by $$\tau_A=\Delta Q_A/\Delta J_A, \tag{8}$$

where $\Delta Q_A$ is a differential amount of $Q_A$, and $\Delta J_A$ is a differential amount of the photocurrent $J_A$ (=$qGW_A$) flowing through $W_A$ layer, $\tau_A$ is given by the following expression, $$\tau_A=[W_A^2/(3D_e)+W_A/v_{th}]. \tag{9}$$

On the other hand, $Q_D$ is given by the following expression because it increases by an amount of $qGW_D^2/2V_h$ in the depleted optical absorption layer, and decreases by an amount of $qGW_D^2/3V_h$ at the interface between the p-type neutral optical absorption layer and the depleted optical absorption layer, $$Q_D=qGW_D^2/6v_h. \tag{10}$$

Considering that $\tau_D$ is given by $$\tau_D=2\Delta Q_D/\Delta J_D, \tag{11}$$

where $\Delta Q_D$ is the differential amount of $Q_D$, and $\Delta J_D$ is the differential amount of the photocurrent $J_D$ (=$qGW_D$) flowing through the $W_D$ layer, $\tau_D$ is given by the following expression, $$\tau_D=W_D/3v_h. \tag{12}$$

The coefficient two must be present (attached) to the right-hand side of expression (11) because the hole current is half the total current, and $\tau_D$ is treated here taking only hole transport.

Next, the optical frequency response of the photodiode with the structure as shown in FIGS. 1 and 3 will be described in general. Assume that $R_1(\omega)$ is an optical frequency response when an optical signal is input to the first semiconductor optical absorption layer (depletion layer), and that $R_2(\omega)$ is an optical frequency response when an optical signal is input to the second semiconductor optical absorption layer (p-type neutral layer). The electrons generated in the second semiconductor optical absorption layer are injected into the first semiconductor optical absorption layer and pass through it. Thus, $R_2(\omega)$ is given by a product $R_{22}(\omega) \cdot R_{21}(\omega)$, where $R_{22}(\omega)$ is an independent response of the second semiconductor optical absorption layer, and $R_{21}(\omega)$ is a response involving the passing of the electrons through the first semiconductor optical absorption layer. Since the present photodiode is composed of InGaAsP based semiconductor materials, the electron speed (transit time) in the first semiconductor optical absorption layer is sufficiently higher (shorter) than the electron speed (transit time) in the second semiconductor optical absorption layer. Accordingly, the design range of the optical absorption layer is actually present, where an approximation for $R_2(\omega)$ given by $R_{22}(\omega)$ is possible.

On the other hand, almost all the current caused by the electrons and holes generated in the first semiconductor optical absorption layer flows toward an external circuit because both ends of the layer are in a charge neutral state (majority carrier is present). Thus, the condition $R_{tot}(\omega)$ to $R_1(\omega)+R_2(\omega)$ can be achieved, which means that the response is obtained just by superimposing the responses in parallel in the structure in which the first semiconductor optical absorption layer and the second semiconductor optical absorption layer are present independently.

Here, a total response $J(\omega)$ of the circuit through which the diffusion current and drift current flow in parallel in the charge control model is given by the following expression, $$J(\omega)=J_{DC}[(W_A/W)/(1+j\omega\tau_A)+(W_D/W)/(1+j\omega\tau_D)]. \quad (13)$$

It is approximated by the following expression in the low frequency region, $$J(\omega)\approx J_{DC}[1-j\omega(W_A\tau_A+W_D\tau_D)/W]. \quad (14)$$

Consequently, the total carrier transit time $\tau_{tot}$ is given by the following expression, $$\begin{aligned}\tau_{tot} &\approx (W_A\tau_A+W_D\tau_D)/W \quad (15)\\ &= [W_A^2/(3D_e)+W_A/v_{th}](W_A/W)+\\ &\quad [W_D/3v_h](W_D/W)\\ &= W_A^3/(3WD_e)+W_A^2/(Wv_{th})+W_D^2/(3Wv_h).\end{aligned}$$

To improve the response speed, it is necessary to minimize $\tau_{tot}$ given by the foregoing expression (15). Accordingly, the response speed (and its measure 3 dB bandwidth) can be maximized by setting the ratio between $W_A$ and $W_D$.

As shown in the expression (15), $\tau_{tot}$ consists of the components $[W_A^2/(3D_e)+W_A/v_{th}](W_A/W)$ and $[W_D/3v_h](W_D/W)$. Thus, it depends on the ratios of $W_A$ and $W_D$ to the total optical absorption layer width W. In this case, the carrier transit times of the photodiodes with the structures where $W_A=0$ (only the depleted semiconductor optical absorption layer) and $W_A=W$ (only the p-type neutral semiconductor optical absorption layer) are equal to the carrier transit times given by the foregoing expressions (1) and (3).

In contrast with this, the $\tau_{tot}$ of the photodiode in accordance with the present invention, in which both $W_A$ and $W_D$ have a finite film thickness can be smaller than $W^2/(3D_e)+W/v_{th}$ and $W/3v_h$. Accordingly, it can achieve $\tau_{tot}$ smaller than that of the pin-PD and UTC-PD, thereby enabling a faster response.

As described above, the photodiode in accordance with the present invention with the structure as shown in FIGS. 1 and 3 can reduce the mutually dependent relationship between the two semiconductor optical absorption regions. As a result, the photodiode has the total response obtained by superimposing the responses of the structures in parallel in which these two regions are present independently.

Figure 4:
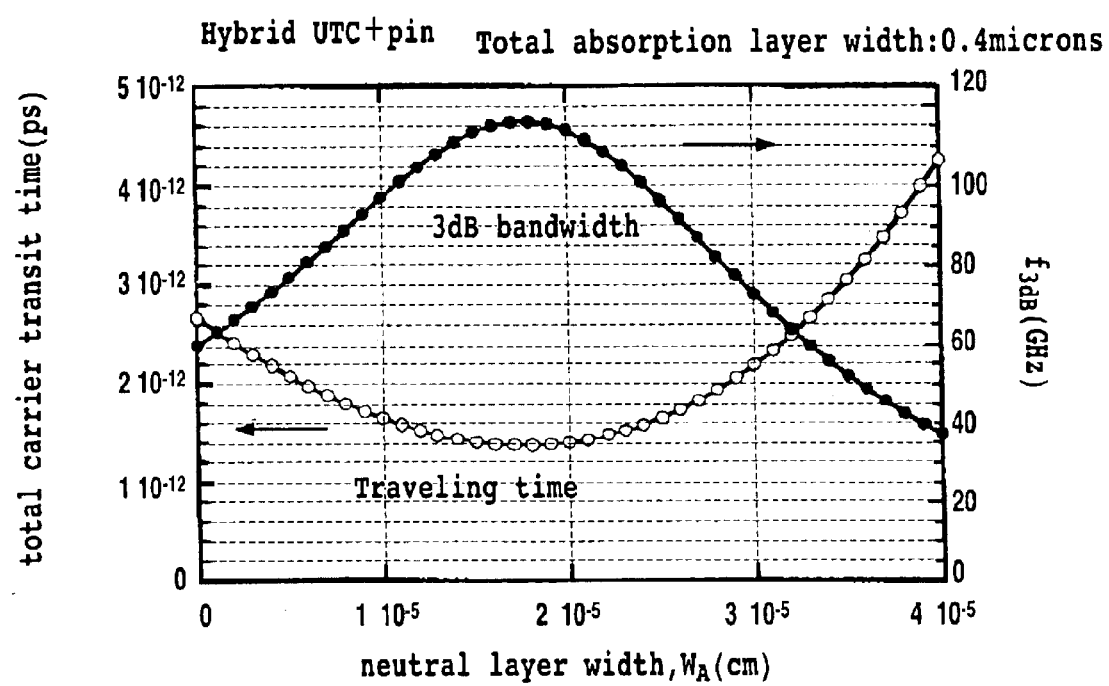
FIG. 4 is a graph illustrating the calculation results of the total carrier transit time $\tau_{tot}$ in the optical absorption layer and the 3 dB bandwidth $f_{3dB}$ of the photodiode in accordance with the present invention including a depleted InGaAs optical absorption layer with a layer width $W_D$ and a p-type neutral InGaAs optical absorption layer with a layer width $W_A$.

FIG. 4 is a graph illustrating the calculation results of the total carrier transit time $\tau_{tot}$ and the 3 dB bandwidth $f_{3dB}$, which are obtained on a basis of the foregoing model in the optical absorption layer of the photodiode in accordance with the present invention including the depleted InGaAs optical absorption layer with the layer width $W_D$ and the p-type neutral InGaAs optical absorption layer with the layer width $W_A$. It illustrates the variations in the total carrier transit time $\tau_{tot}$ and the 3 dB bandwidth $f_{3dB}$ for the ratio of $W_A$ to W under the conditions that the diffusion coefficient of the electrons is $D_e=200$ cm$^2$/s, the hole speed is $v_h=5\times10^6$ cm/s, and the total thickness of the InGaAs optical absorption layer is constant at $W=W_A+W_D=0.4$ $\mu$m.

As is seen from FIG. 4, the photodiode in accordance with the present invention has the maximum value 116 GHz for $f_{3dB}$ at $W_A=0.18$ $\mu$m ($W_D=0.22$ $\mu$m). In contrast, the pin-PD has $f_{3dB}$ of 60 GHz at $W_A=0$ ($W_D=W$), and the UTC-PD has $f_{3dB}$ of 37 GHz at $W_A=W$ ($W_D=0$). Thus, the photodiode in accordance with the present invention can increase $f_{3dB}$ sharply. Since the $\tau_{tot}$ increases with an increase in the total optical absorption layer width W, the combination of $W_A$ and $W_D$ that maximizes the bandwidth is also the combination of maximizing the internal quantum efficiency for a given bandwidth.

(EMBODIMENT 2)

Figure 5:
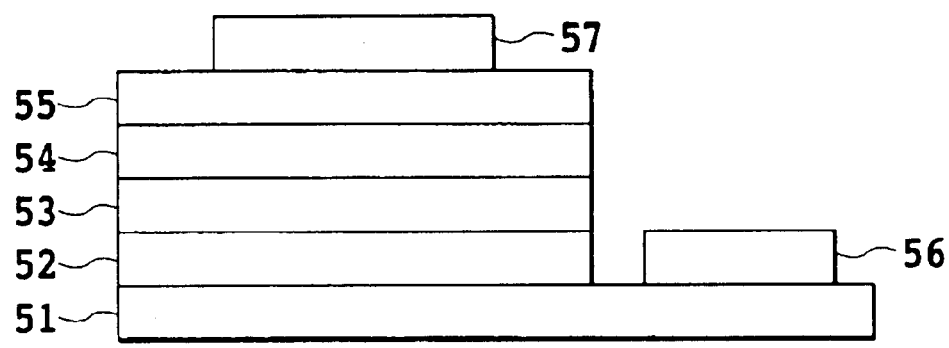
FIG. 5 is a cross-sectional view showing another structure of the photodiode in accordance with the present invention.

FIG. 5 is a cross-sectional view showing a structure of the photodiode in accordance with the present invention. The photodiode includes an n-type semiconductor electrode layer 51 composed of a single-layer or multiple-layers with different band gaps; a semiconductor optical transmission layer 52 depleted in the reverse-biased state; a first semiconductor optical absorption layer 53 with a film thickness $W_D$ which is depleted in the reverse-biased state; a second semiconductor optical absorption layer 54 with a film thickness $W_A$ which is p-type neutral in the reverse-biased state; and a p-type semiconductor electrode layer 55 composed of the single-layer or multiple-layers with different band gaps. The photodiode is compose of these layers stacked sequentially, and an n-type electrode 56 formed on the n-type semiconductor electrode layer 51, and a p-type electrode 57 formed on the p-type semiconductor electrode layer 55. The semiconductor optical transmission layer 52 is designed to have a greater band gap than the first semiconductor optical absorption layer 53.

Figure 6:
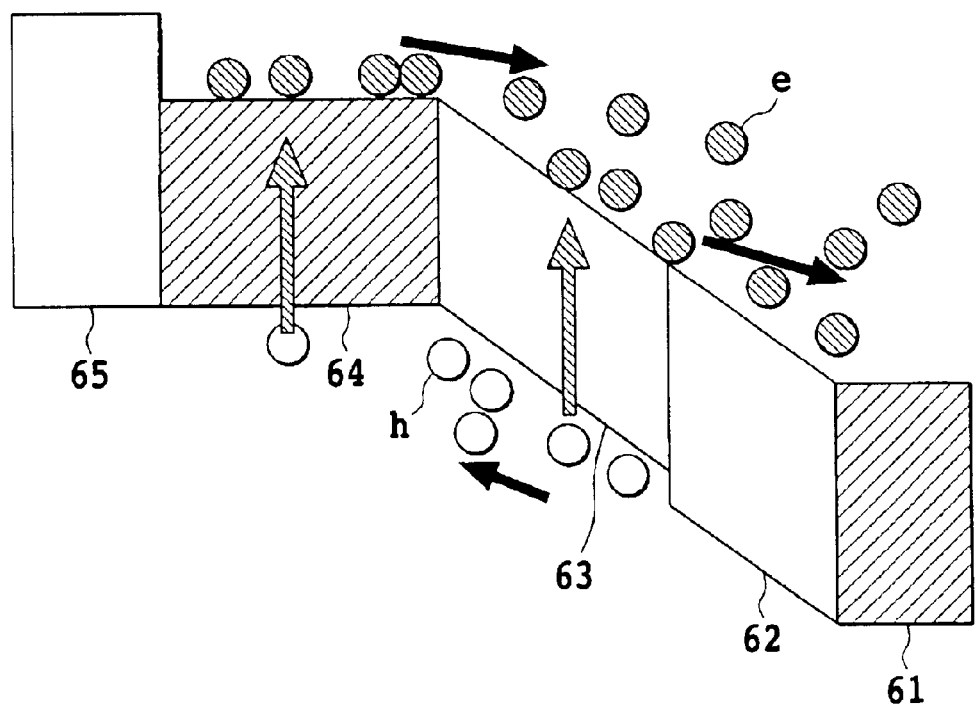
FIG. 6 is a band diagram illustrating the carrier drift in the semiconductor optical absorption layer constituting the photodiode in accordance with the present invention as shown in FIG. 5.

FIG. 6 is a band diagram illustrating a drift of carriers generated in the p-type neutral semiconductor optical absorption layer and the depleted semiconductor optical absorption layer as shown in FIG. 5. When the semiconductor optical absorption layer of a semiconductor structure is illuminated which includes an n-type semiconductor electrode layer 61 composed of a single-layer or multiple-layers with different band gaps, a semiconductor optical transmission layer 62 depleted in the reverse-biased state, a first semiconductor optical absorption layer 63 with a film thickness of $W_D$ which is depleted in the reverse-biased state, a second semiconductor optical absorption layer 64 with a film thickness of $W_A$ which is p-type neutral in the reverse-biased state, and a p-type semiconductor electrode layer 65 composed of the single-layer or multiple-layers with different band gaps, which are stacked sequentially, electron-hole pairs are generated in the individual semiconductor optical absorption layers. The electrons drift toward the n-type semiconductor electrode 61, whereas the holes drift toward the p-type semiconductor electrode 65, thereby implementing the condition in which the current flows through a parallel circuit, so to speak.

In the photodiode with the structure as shown in FIG. 5, the semiconductor optical transmission layer 52 is designed to be depleted in the reverse-biased state. Accordingly, a marked increase does not occur of the electron charges in the semiconductor optical transmission layer 52 during the operation, thereby being able to increase the pn junction width and to reduce the junction capacitance. In addition, the carrier transit time through the depleted first semiconductor optical absorption layer 53 little varies as long as the transit time of the holes is constant, and hence the total carrier transit time $\tau_{tot}$ little increases.

The total carrier transit time ($\tau_{tot}$) is given by the following expression by handling the diode response according to the charge control model as in the foregoing embodiment 1 under the conditions that the first semiconductor optical absorption layer has a layer width $W_D$, the second semiconductor optical absorption layer has a layer width $W_A$, the semiconductor optical transmission layer has a layer width $W_T$, and that the sum W ($=W_D+W_A$) of the layer widths of the first and second semiconductor optical absorption layers is constant, $$\tau_{tot}=W_A^3/(3WD_e)+W^2_A/(Wv_{th})+[W_D^3/(W_D+W_T)]/(3Wv_h). \qquad (16)$$

Comparing the result with the foregoing expression (15), it is seen that the third term of the expression (16) is reduced by an amount $W_D/(W_D+W_T)$.

In other words, the photodiode with the structure as shown in FIG. 5 has an advantage that even when $W_A$ and $W_D$ are reduced, the pn junction width is not narrowed, and hence the bandwidth is not impaired with an increase of a junction capacitance C and RC time constant, thereby being able to implement a photodiode with a structure advantageous to the high-speed operation.

INDUSTRIAL APPLICABILITY

As described above, the photodiode in accordance with the present invention has the optical absorption layer composed of the depleted first semiconductor optical absorption layer with the layer width $W_D$ and the p-type neutral second semiconductor optical absorption layer with the layer width $W_A$, and sets the ratio between $W_A$ and $W_D$ such that the total carrier transit time $\tau_{tot}$ becomes minimum. As a result, it can greatly alleviate the problem of the "tradeoff between the response speed and internal quantum efficiency" of the conventional photodiode.

In particular, the photodiode in accordance with the present invention can obviate the restriction on the design of the conventional photodiode used for a ultrafast signal processing ($\geq 40$ Gbit/s) that it must secure the bandwidth at the expense of the internal quantum efficiency by reducing the optical absorption layer width.

What is claimed is:

1. A photodiode including an n-type semiconductor electrode layer, an optical absorption layer having a first semiconductor optical absorption layer and a second semiconductor optical absorption layer having a p-type, and a p-type semiconductor electrode layer, which are stacked sequentially, said photodiode further including an n-type electrode formed on said n-type semiconductor electrode layer, and a p-type electrode formed on said p-type semiconductor electrode layer, wherein when a specified reverse-bias is applied across said n-type electrode and said p-type electrode, said first semiconductor optical absorption layer is depleted, and said second semiconductor optical absorption layer remains neutral in a region other than a region near an interface with said first semiconductor optical absorption layer, and wherein in said optical absorption layer with a fixed layer width equal to a sum ($W=W_D+W_A$) of a layer width ($W_D$) of said first semiconductor optical absorption layer and a layer width ($W_A$) of said second semiconductor optical absorption layer, a ratio between $W_D$ and $W_A$ is determined such that $|\Delta \tau_A|=|-\Delta \tau_D|$ holds, where $-\Delta \tau_D$ is a decrease of a hole transit time through said first semiconductor optical absorption layer and $\Delta \tau_A$ is an increase of an electron transit time through said second semiconductor optical absorption layer, when the layer width of said first semiconductor optical absorption layer is made $W_D-\Delta W$, and the layer width of said second semiconductor optical absorption layer is made $W_A+\Delta W$.

2. The photodiode as claimed in claim 1, further including a semiconductor optical transmission layer between said first semiconductor optical absorption layer and said n-type semiconductor electrode layer, said semiconductor optical transmission layer having a band gap greater than said first semiconductor optical absorption layer, wherein said semiconductor optical transmission layer is depleted when a specified reverse-bias is applied across said n-type electrode and said p-type electrode.

3. The photodiode as claimed in claim 1, wherein said first semiconductor optical absorption layer and said second semiconductor optical absorption layer are composed of a same or different compound semiconductor with composition represented by $In_xGa_{1-x}As_yP_{1-y}$, where $0 \leq x$ and $y \leq 1$.

4. The photodiode as claimed in claim 3, further including a semiconductor optical transmission layer between said first semiconductor optical absorption layer and said n-type semiconductor electrode layer, said semiconductor optical transmission layer having a band gap greater than said first semiconductor optical absorption layer, wherein said semiconductor optical transmission layer is depleted when a specified reverse-bias is applied across said n-type electrode and said p-type electrode.

5. The photodiode as claimed in claim 3, wherein the ratio between said $W_D$ and $W_A$ is set such that $\tau_{tot}$ given by the following expression becomes minimum, $$\tau_{tot}=W_A^3/(3WD_e)+W_A^2/(Wv_{th})+W_D^2/(3Wv_h),$$

where $D_e$ is a diffusion coefficient of electrons, $v_{th}$ is a thermionic emission velocity of the electrons, and $v_h$ is a drift speed of holes.

6. The photodiode as claimed in claim 5, further including a semiconductor optical transmission layer between said first semiconductor optical absorption layer and said n-type semiconductor electrode layer, said semiconductor optical transmission layer having a band gap greater than said first semiconductor optical absorption layer, wherein said semiconductor optical transmission layer is depleted when a specified reverse-bias is applied across said n-type electrode and said p-type electrode.

* * * * *